US008891782B2

(12) United States Patent
Kim et al.

(10) Patent No.: US 8,891,782 B2
(45) Date of Patent: Nov. 18, 2014

(54) APPARATUS AND METHOD FOR SOUND FOCUSING

(75) Inventors: Young-tae Kim, Seongnam-si (KR); Jung-woo Choi, Hwaseong-si (KR); Jung-ho Kim, Yongin-si (KR); Sang-chul Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 903 days.

(21) Appl. No.: 12/780,099

(22) Filed: May 14, 2010

(65) Prior Publication Data

US 2010/0296660 A1 Nov. 25, 2010

(30) Foreign Application Priority Data

May 22, 2009 (KR) ........................ 10-2009-0044999

(51) Int. Cl.

*H03B 29/00* (2006.01)
*H04R 1/32* (2006.01)
*H04R 3/12* (2006.01)
*H04R 1/40* (2006.01)

(52) U.S. Cl.

CPC *H04R 3/12* (2013.01); *H04R 1/403* (2013.01); *H04R 2499/11* (2013.01); *H04R 1/323* (2013.01)
USPC ........... 381/71.7; 381/59; 381/71.6; 381/71.1

(58) Field of Classification Search

USPC ............... 381/58–59, 77.1, 77.7, 77, 80, 111, 381/116, 163, 71.6–71.7
See application file for complete search history.

(56) References Cited

U.S. PATENT DOCUMENTS

| | | | | |
|---|---|---|---|---|
| 5,717,766 | A * | 2/1998 | Azoulay et al. | 381/300 |
| 6,816,598 | B1 * | 11/2004 | Budge | 381/89 |
| 6,985,593 | B2 | 1/2006 | Nicholas et al. | |
| 7,191,022 | B1 * | 3/2007 | Kakuhari et al. | 700/94 |
| 7,346,315 | B2 | 3/2008 | Zurek et al. | |
| 7,515,719 | B2 | 4/2009 | Hooley et al. | |
| 7,551,749 | B2 | 6/2009 | Rosen et al. | |
| 7,702,320 | B2 | 4/2010 | Komura | |
| 7,983,436 | B2 * | 7/2011 | Nichols et al. | 381/335 |
| 8,144,583 | B2 * | 3/2012 | Adhikari et al. | 370/232 |
| 8,144,883 | B2 * | 3/2012 | Pedersen | 381/59 |
| 8,396,240 | B2 | 3/2013 | Rosen | |

(Continued)

FOREIGN PATENT DOCUMENTS

| | | |
|---|---|---|
| CN | 1819710 A | 8/2006 |
| EP | 1037501 A1 | 9/2000 |

(Continued)

OTHER PUBLICATIONS

European Search Report issued Jan. 30, 2014, in counterpart European Patent Application No. 10163396.4-1910.

(Continued)

*Primary Examiner* — Disler Paul
(74) *Attorney, Agent, or Firm* — NSIP Law

(57) ABSTRACT

A sound focusing technique is provided to transfer sound to a particular direction. In a sound focusing apparatus, first and second speakers may be arranged to emit sound in opposite directions to form a sound zone. An amplitude and/or a phase of a received signal may be adjusted by a signal processing unit to assign the received signal and the adjusted signal to the first and second speakers, respectively.

33 Claims, 10 Drawing Sheets

100

(56) References Cited

U.S. PATENT DOCUMENTS

| | | | | |
|---|---|---|---|---|
| 8,457,324 | B2 * | 6/2013 | Tice | 381/71.7 |
| 2001/0012371 | A1 * | 8/2001 | Baumhauer et al. | 381/345 |
| 2002/0131608 | A1 | 9/2002 | Lobb et al. | |
| 2007/0041590 | A1 * | 2/2007 | Tice | 381/77 |
| 2007/0092091 | A1 * | 4/2007 | Noro et al. | 381/111 |
| 2007/0092099 | A1 * | 4/2007 | Nakano | 381/387 |
| 2008/0008329 | A1 | 1/2008 | Pdersen | |

FOREIGN PATENT DOCUMENTS

| | | |
|---|---|---|
| JP | 09-247784 | 9/1997 |
| JP | 11-127494 | 5/1999 |
| JP | 2000-324589 | 11/2000 |
| JP | 2002-111817 | 4/2002 |
| JP | 2005-292250 | 10/2005 |
| KR | 100878110 | 1/2009 |
| KR | 1020090019172 | 2/2009 |
| WO | WO 2005/104611 A1 | 11/2005 |
| WO | WO 2007/021861 A2 | 2/2007 |

OTHER PUBLICATIONS

Chinese Office Action issued Nov. 12, 2013 in counterpart Chinese Patent Application No. 201010179161.3 (19 pages) in Korean, including English Translation.

Japanese Office Action issued Oct. 8, 2013 in counterpart Japanese Patent Application No. P2010-117065 (4 pages, in Japanese with English Translation).

* cited by examiner

APPARATUS AND METHOD FOR SOUND FOCUSING

CROSS REFERENCE TO RELATED APPLICATION

This application claims the benefit under 35 U.S.C. §119 (a) of a Korean Patent Application No. 10-2009-0044999, filed on May 22, 2009, the entire disclosure of which is incorporated herein by reference for all purposes.

BACKGROUND

1. Field

The following description relates to a sound focusing technology to focus sound to a particular area.

2. Description of the Related Art

Interest has grown with regards to a technology which can transfer sound to a specific listener or a particular area, without using a headset or earphones.

To focus sound on a particular area, a method of maximizing directivity of sound transferred through the air may be performed with a speaker having an ultrasonic transducer for high power/high frequency oscillation, or with a sound wave guide such as a horn and reflector.

However, it is understood that the above methods have relatively low transmission efficiency. Moreover, the above methods may induce sound distortion that may not be acceptable to general electronic devices.

In another method, an array speaker may be formed of a plurality of speakers in which a delay is assigned to a signal to be input to each of the plurality of speakers such that the direction of sound output from the plurality of speakers is focused in a given direction. This method assigns different delays to signals to be transferred to the speakers on the basis of beamforming theory or phased array antenna theory.

However, such a method requires a plurality of array speakers in order to ensure sufficient sound pressure. Accordingly, it is difficult to apply this approach to relatively smaller devices such as mobile or handheld devices.

SUMMARY

In one general aspect, there is provided a sound focusing technique which forms a sound zone using a plurality of monopole speakers.

In another general aspect, there is provided a sound focusing apparatus including a speaker unit having first and second speakers which output sound in different directions, and a signal processing unit configured to process a signal to be transmitted to the speaker unit such that sound fields overlap in a first area and cancel in a second area.

The first and second speakers may be placed on the same axis and output sound in opposite directions.

Each of the first and the second speakers may be a monopole speaker.

The first area may correspond to a front of the first speaker and the second area may correspond to a front of the second speaker.

The signal processing unit may receive the signal, apply a filter to the received signal that adjusts an amplitude and/or a phase of the signal, and assign the received signal and the filtered signal to the first speaker and the second speaker, respectively.

The filter may be defined based on a ratio between an acoustic transfer characteristic of the first speaker and an acoustic transfer characteristic of the second speaker.

The sound focusing apparatus may further include an update unit to update the filter using a sound measurement result of the second area.

The update unit may include a microphone provided to obtain the sound measurement result of the second area.

In still another general aspect, there is provided a sound focusing method of a sound focusing apparatus having a first speaker and a second speaker that output sound in different directions, the method including receiving a signal and adjusting an amplitude and/or a phase of the received signal by use of a filter, and assigning the received signal and the adjusted signal to the first speaker and the second speaker, respectively, such that sound fields overlap in a first area and cancel in a second area.

The first and second speakers may be placed on the same axis and output sound in opposite directions.

The filter may be defined based on a ratio between an acoustic transfer characteristic of the first speaker and an acoustic transfer characteristic of the second speaker.

The first area may correspond to the front of the first speaker and the second area may correspond to the front of the second speaker.

The sound focusing method may further include updating the filter using a sound measurement result of the second area.

In yet another general aspect, there is provided a portable sound focusing apparatus including a speaker unit having first and second speakers to output sound, and a signal processing unit configured to process a signal to be transmitted to the speaker unit such that sound fields overlap to reinforce the sound in a first area and cancel to weaken or prevent the sound in a second area.

A back of the first speaker may face a back of the second speaker and the first and second speakers may output the sound in opposite directions.

The first and second speakers may be placed on the same axis such that the centerline of a loudspeaker of the first speaker passes through a point substantially corresponding to the centerline of a loudspeaker of the second speaker.

The first area may correspond to a front of the first speaker and the second area may correspond to a front of the second speaker.

The signal processing unit may receive the signal, apply a filter to the received signal that adjusts an amplitude and/or a phase of the signal, and assign the received signal and the filtered signal to the first speaker and the second speaker, respectively, such that the sound fields overlap in the first area and cancel in the second area.

The filter may be defined based on a ratio between an acoustic transfer characteristic of the first speaker and an acoustic transfer characteristic of the second speaker.

The portable sound focusing apparatus may further include an update unit to update the filter using a sound measurement result of the second area.

The update unit may include a microphone provided to obtain the sound measurement result of the second area, and the update unit may update the filter to adaptively control a signal to be assigned to the second speaker.

The update unit may update the filter substantially in real time using the sound measurement result of the second area.

The portable sound focusing apparatus may be a mobile phone.

The portable sound focusing apparatus may further include another speaker unit having first and second speakers to output sound, wherein the speaker unit and the another speaker unit process an R-channel signal and an L-channel signal, respectively, to provide a stereo sound.

The signal processing unit may generate a signal q1 and a signal q2 by use of a filter corresponding to an equation, $$C_1 = \mu \frac{H_2(j\omega)}{H_1(j\omega)},$$

where $C_1$ represents the filter, μ represents a pattern control parameter which allows a shape of a sound zone to be changed, $H_1(j\omega)$ represents an acoustic transfer characteristic of the first speaker, and $H_2(j\omega)$ represents an acoustic transfer characteristic of the second speaker, such that the relationship between the signal q1 and the signal q2 is represented as, $q_2=q_1e^{-jkd}$ or $\mu=-e^{-jkd}$, where $e^{-jkd}$ represents a complex number.

In still yet another general aspect, there is provided an electrical device including a body including a first side and a second side opposite the first side, a first speaker having front and back portions and mounted to the first side of the body, and a second speaker having front and back portions and mounted to the second side of the body such that the back portion of the second speaker faces the back portion of the first speaker and the front portions of the first and second speakers face opposite directions.

The first and second speakers may be mounted on an axis traversing the first and second sides of the body.

Each of the first and second speakers may be a monopole speaker.

The electrical device may further include a display mounted to the first side of the body.

The electrical device may be a mobile phone.

An imaginary line traversing the first and second sides of the body may pass through centers of the first and second speakers.

The first and second speakers may have a substantially identical frequency response.

The first and second speaker may be substantially identical.

The back portion of the first speaker and the back portion of the second speaker may be separated by about 0.1 cm to 7.0 cm.

The back portion of the first speaker and the back portion of the second speaker may be in contact with each other.

Other features and aspects will be apparent from the following detailed description, the drawings, and the claims.

Figure 1:
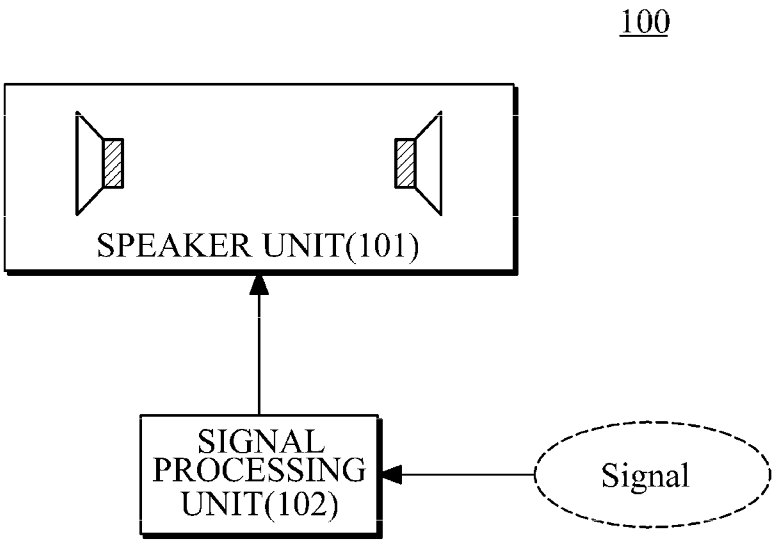
FIG. 1 is a diagram illustrating a configuration of an example of a sound focusing apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and constructions may be omitted for increased clarity and conciseness.

FIG. 1 illustrates a configuration of an example of a sound focusing apparatus 100. Referring to FIG. 1, the sound focusing apparatus 100 includes a speaker unit 101 and a signal processing unit 102.

The speaker unit 101 includes a plurality of speakers which output signals in different directions. For example, the speaker unit 101 may include two monopole speakers placed back to back. In the back-to-back placement, for example, two monopole speakers are arranged such that one monopole speaker outputs sound in a first direction and the other monopole speaker outputs sound in a second direction which is opposite to the first direction.

As a non-limiting illustration only, a monopole speaker generally includes a diaphragm producing sound through vibration and a box surrounding the upper, lower and rear edges of the diaphragm, for example.

The signal processing unit 102 processes a signal to be transferred to each speaker of the speaker unit 101 such that sound fields can overlap in a first area and can be cancelled in a second area.

When sound fields overlap or cancel each other in an area, a sound zone can be formed. For example, the sound may be reinforced in the first area in which the sound fields overlap, and in contrast, the sound may weaken in the second area in which the sound fields cancel. Thus by forming the sound zone, when people are present in the first and second areas, it is possible to transfer sound to a listener in the first area and preventing a listener in the second area from exposure to the sound.

The signal processing unit 102 adjusts an amplitude and/or a phase of a signal to be transferred to the speaker unit 101 to form the sound zone.

For example, the signal processing unit 102 applies a filter to a received signal to adjust the amplitude and the phase of the received signal. The filter may be defined using an acoustic transfer characteristic of the speaker unit 101 and a pattern control parameter of the sound zone.

Figure 2:
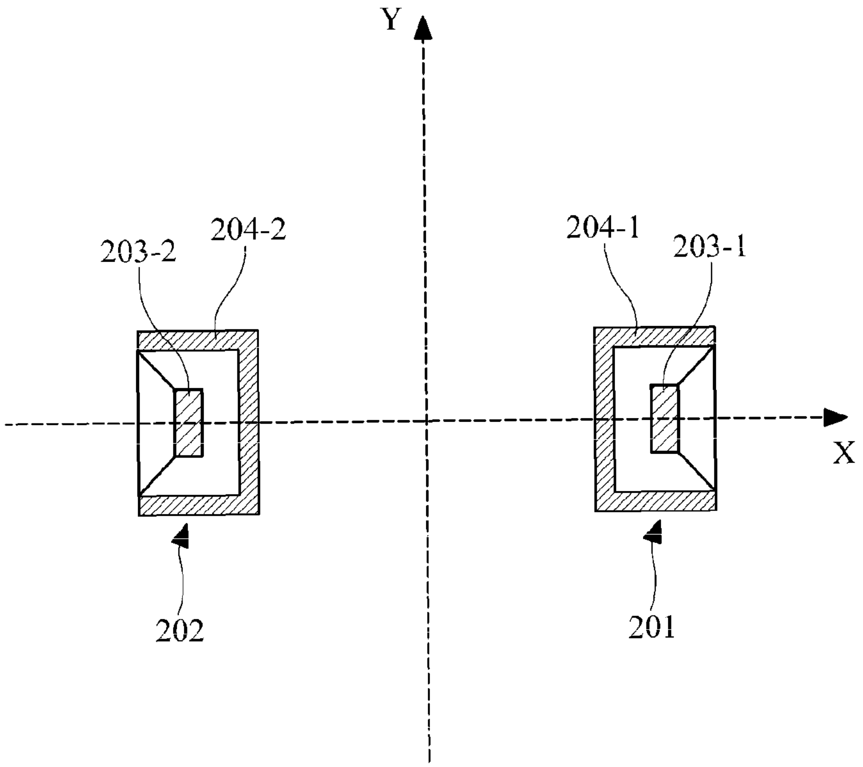
FIG. 2 is a diagram illustrating a speaker unit of FIG. 1 including speakers positioned in a back-to-back placement.

FIG. 2 illustrates the speaker unit 101 of FIG. 1 having speakers positioned in a back-to-back arrangement, for example. The speaker unit 101 includes a first speaker 201 and a second speaker 202.

The first speaker 201 includes a front portion 203-1 and a rear portion 204-1, and the second speaker 202 includes a front portion 203-2 and a rear portion 204-2. Each of the front portions 203-1 and 203-2 may be a front part of a speaker including a diaphragm producing sound by way of diaphragm vibration. Each of the rear portions 204-1 and 204-2 may be a rear part of a body, for example, a box, to receive the diaphragm.

In this example, the first speaker 201 and the second speaker 202 are placed on the same axis. Accordingly, a region may be formed where the sound wave is transferred in a +X direction and a region may be formed were the sound wave is cancelled in a −X direction. Suitable results may be achieved using other placement, adjustment, and variations. As shown in FIG. 2, the first speaker 201 and the second speaker 202 may be placed on an X-axis.

In this example, the first speaker 201 and the second speaker 202 may have substantially an identical frequency response. To have a substantially identical frequency response, the first speaker 201 and the second speaker 202 may be substantially identical structures. Also, while structurally different, the first speaker 201 and the second speaker 202 may have a substantially identical frequency response by adjusting the relevant dimensions and/or materials constituting the speakers 201 and 202.

While shown as spaced apart, the rear portion 204-1 and the rear portion 204-2 may be in contact with each other. Depending on the type of electrical devices to which the speakers 201 and 202 are mounted, the rear portions 204-1 and 204-2 maybe separated by 0 to several centimeters. For example, the rear portions 204-1 and 204-2 may be separated by about 0.1 to 2.0 cm in mobile phones and by about 0.1 to 7.0 cm in televisions or monitors.

In one example implementation, if the sound focusing apparatus 100 is employed to a mobile phone, the right side (+X direction) of a Y-axis may be a front side of the mobile phone, e.g., a direction facing a user, and the left side (−X direction) of the Y-axis may be a rear side of the mobile phone, e.g., a direction opposite to or facing away the user. For example, if the speaker unit 101 is disposed adjacent to a display, for example, a liquid crystal display (LCD) panel, of the mobile phone, the first speaker 201 may be placed to emit sound from the same side of the mobile phone as that of the LCD panel and the second speaker 202 may be placed to emit sound in an opposite direction, e.g., from a rear side of the mobile phone.

In the example shown in FIG. 2, the first speaker 201 and the second speaker 202 are arranged to face in opposite directions. As shown, the rear portion 204-1 of the first speaker 201 faces the rear portion 204-2 of the second speaker 202 in an overlapping manner.

In one general aspect, an area in front of the first speaker 201 may be defined as a first area where sound fields overlap each other, and an area in front of the second speaker 202 may be defined as a second area where cancellation of sound fields occur.

The overlap and cancellation of sound fields allow the formation of a sound zone, and a shape, a size, and a location of the sound zone may vary with a phase and an amplitude of a signal input through each of the first and second speakers 201 and 202.

Figure 3:
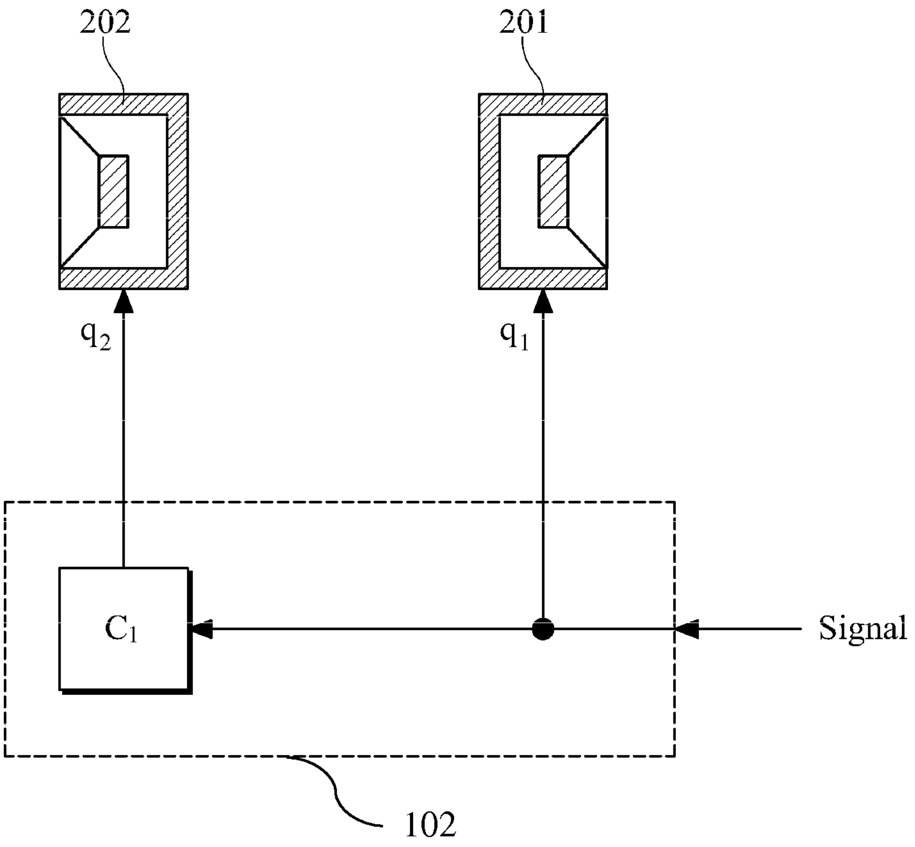
FIG. 3 is a diagram illustrating a signal processing unit of FIG. 1.

FIG. 3 illustrates the signal processing unit 102 of FIG. 1.

In FIG. 3, the signal processing unit 102 receives a signal, and generates a signal q1 and a signal q2. The received signal may be an acoustic signal to be input to the speaker unit 101. The signal q1 may be the received signal received by the signal processing unit 102, and the signal q2 may be a signal generated by applying a filter C1 to the received signal.

The signal processing unit 102 may assign the signal q1 to the first speaker 201 and assign the signal q2 to the second speaker 202. The filter C1 of the signal processing unit 102 may be provided to adjust a phase and/or an amplitude of the received signal. For example, an infinite impulse response (IIR) filter or a (mite impulse response (FIR) filter may be used as the filter C1. In another example, the filter C1 may be implemented as an analog filter.

The filter C1 may be represented as Equation 1 below.

$$C_1 = \mu\frac{H_2(j\omega)}{H_1(j\omega)} \quad \text{[Equation 1]}$$

Here, μ represents a pattern control parameter which allows a shape of a sound zone to be changed. $H_1(j\omega)$ represents an acoustic transfer characteristic of the first speaker 201 and $H_2(j\omega)$ represents an acoustic transfer characteristic of the second speaker 202.

Figure 4:
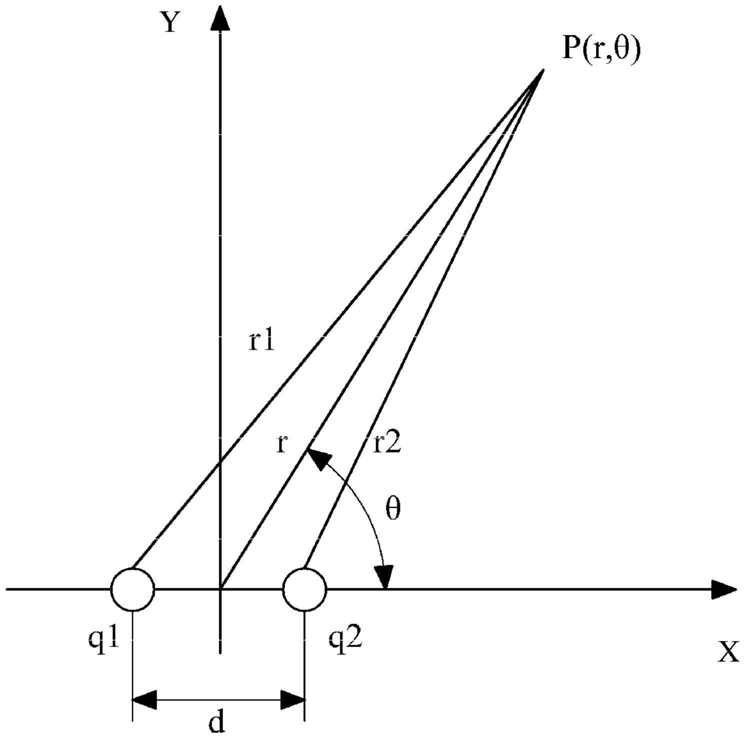
FIG. 4 is a diagram for explaining operation principles of the sound focusing apparatus of FIG. 1.

An example of operating principles of the sound focusing apparatus 100 of FIG. 1 will be described with reference to FIG. 4. In FIG. 4, q1 and q2 denote monopole acoustic sources existing in a certain space, and p(r, θ) denotes a sound field generated by monopole acoustic sources.

p(r, θ) may be represented as Equation 2 below:

$$\begin{aligned} p(r,\theta) &= \frac{j\omega\rho_0 q_1 e^{-jkr_1}}{4\pi r_1} + \frac{j\omega\rho_0 q_2 e^{-jkr_2}}{4\pi r_2} \\ &= H_1(j\omega)q_1 + H_2(j\omega)q_2 \end{aligned} \quad \text{[Equation 2]}$$

When a distance d between the monopole acoustic sources is smaller than a frequency (kd<<1), Equation 2 may be approximated as Equation 3 below.

$$\begin{aligned} p(r,\theta) &= \frac{j\omega\rho_0 e^{-jkr}}{4\pi r} q_1(1 + \mu e^{jkd\cos\theta}) \\ &= q_1 H_1(j\omega)\left(1 + \mu\frac{H_2(j\omega)}{H_1(j\omega)}\right),\ \mu = \frac{q_2}{q_1} \end{aligned} \quad \text{[Equation 3]}$$

When p(r, θ=0)=0 in Equation 3, the relationship between q1 and q2 may be represented as Equation 4 below.

$$q_2 = -q_1 e^{-jkd} \text{ or } \mu = -e^{-jkd} \quad \text{[Equation 4]}$$

It is noted that a particular radiation pattern which cancels p(r, θ), a sound field, in a direction where θ is 0 may be generated when an acoustic source like Equation 4 is given. In other words, controlling outputs of the acoustic sources located on the same axis allows generation of a pattern that transmits a sound wave in a +X-direction and cancels a sound wave in a −X-direction. A mathematical form of a complex representation may describe harmonic waves traveling in a positive direction. For example, $k=\omega/c_o=2\pi/\lambda$ refers to a wave number, where $\omega=2\pi/T$ is the angular frequency of a harmonic fluctuation having a period T, $C_o$ is the speed of sound, and λ is the wavelength. The term $e^{-jkd}$ represents a complex number which can be interpreted by using the identity $e^{j\theta}=\cos\theta+j\sin\theta$, where cos θ and sin θ define the real and imaginary parts of the complex number.

Referring to FIG. 3 again on the basis of the above example of operation principles, the signal processing unit 102 may generate a signal q1 and a signal q2 by applying the filter C1 that adjusts an amplitude and/or a phase of a received signal, such that the relationship between the signal q1 and the signal q2 can be represented as Equation 4. For example, the signal q1 may be the intact received signal and the signal q2 may be a signal generated by applying a filter to the received signal such that the relationship between the signal q1 and the signal q2 is represented based on Equation 4.

When the signal q1 and the signal q2 are assigned to the first speaker 201 and the second speaker 202, respectively, the sound output from each of the first and second speakers 201 and 202 overlaps in a particular area and is cancelled in another area to produce a specific sound zone.

Figure 5A:
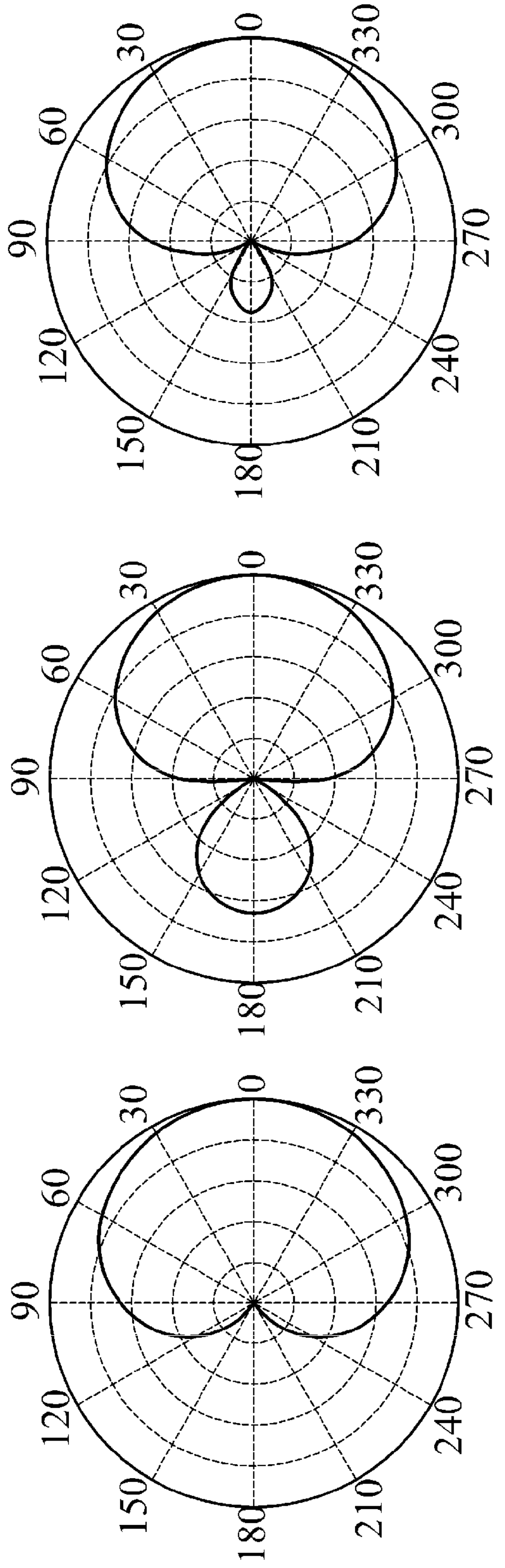
FIG. 5A illustrates examples of sound zones and FIG. 5B illustrates an example signal processing process to generate various forms of a sound zone.
Figure 5B:
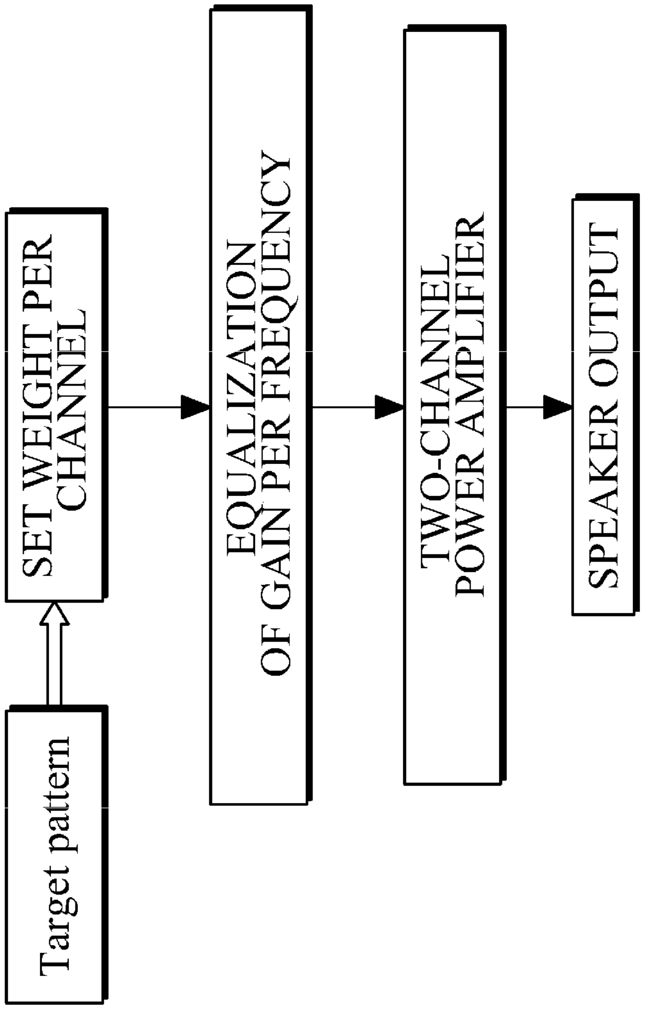

FIG. 5A illustrates examples of sound zones. In FIG. 5A, the first and second speakers 201 and 202 (see FIG. 2 or 3) are located at the center of concentric circles, and a solid line represents a shape of the sound zone. The shape of the sound zone may be changed according to a pattern control parameter of the filter C1, μ of Equation 3. Moreover, a size and a location of the sound zone may be controlled according to an acoustic transfer characteristic of each of the first and second speakers 201 and 202. With reference to FIG. 5B, the description of a signal processing process to generate various forms of a sound zone through the pattern control parameter will be provided below. First, μ, a pattern control parameter, is determined according to a desired shape of the sound zone, and then two channel signals q1 and q2 of Equation 3 are produced. Thereafter, at least one of the channel signals is allowed to pass through a frequency gain control filter that adjusts gain for each frequency in order to compensate for a change of a frequency response, the two channel signals are amplified by an independent two-channel amplifier, and then the amplified signals are, respectively, output through a speaker facing forward, for example, facing toward a user, and a speaker facing backward, for example, facing away from the user, so that a desired shape of the sound zone can be formed.

Mobile devices may reproduce sound when held at a distance. A mobile phone, for example, may have a speakerphone mode so that a display screen can be viewed while holding a conversation. In such an environment, the mobile phone may emit sound over a large solid angle, so that, for example other people positioned around a user of the mobile phone can hear the conversation. As shown in example 5A, sound levels reproduced may be maximized toward a user's position, while reducing the sound levels in other directions. This is, a spatial region having high acoustic potential energy can be realized at the user's position, a direction towards the user at 0° in FIG. 5A, where sound fields emitted from loudspeakers are superposed, while in the other directions, the sound fields are cancelled as shown in FIG. 5A.

Figure 6:
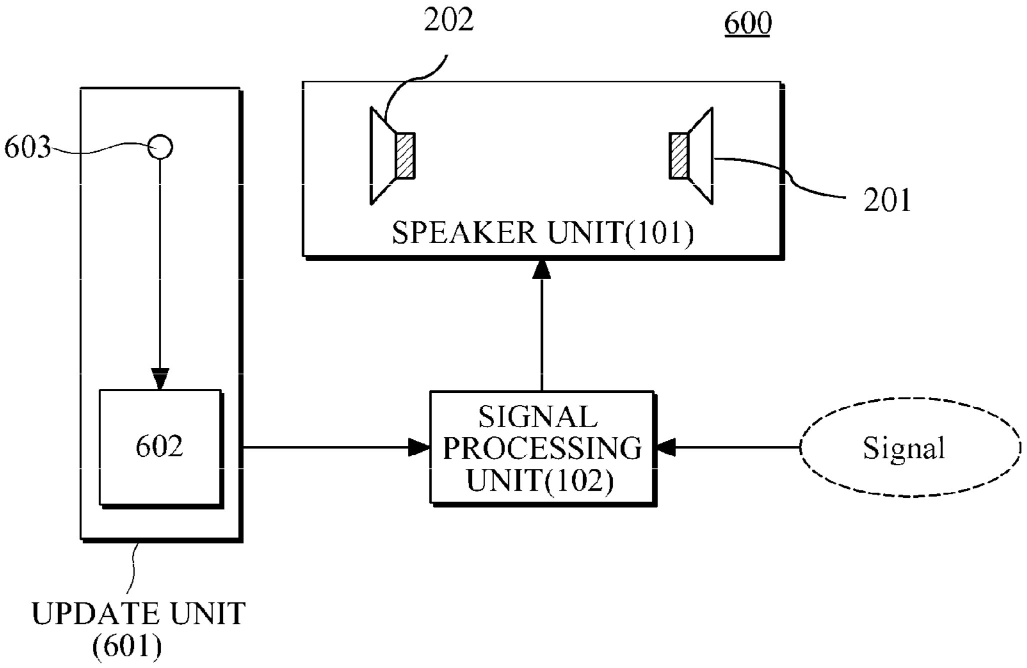
FIG. 6 is a diagram illustrating another example of a sound focusing apparatus.

FIG. 6 illustrates another example of a sound focusing apparatus 600. Referring to FIG. 6, the sound focusing apparatus 600 include a speaker unit 101, a signal processing unit 102, and an update unit 601.

The speaker unit 101 may include a first speaker 201 and a second speaker 202 which are placed on the same axis and output sound in opposite directions, for example.

The signal processing unit 102 may receive a signal and apply a filter C1 to the received signal to adjust an amplitude and/or a phase of the signal. In addition, the signal processing unit 102 may assign the received signal, a signal q1, and the filtered signal, a signal q2, to the first speaker 201 and the second speaker 202, respectively.

The update unit 601 may update the filter C1 using a sound measurement result in a second area. Here, the second area may be an area where a sound field is to be cancelled.

The update unit 601 may include a microphone 603 for measuring sound and a filter update portion 602 for filter update. For example, the update unit 601 uses the microphone 603 arranged in a sound field cancellation area, the second area, to measure a sound field in a corresponding area, and the filter update portion 602 may control a signal to be assigned to the second speaker 202 adaptively, according to the sound measurement result of the microphone 603.

In one example implementation where the sound focusing apparatus 600 is applied to a mobile phone, the sound zone may be formed such that, in a first area, for example, near an ear of a user using the phone, sound field overlap occurs, and in a second area, for example, away from the ear of the user, sound field cancellation takes place. In addition, the update unit 601 may update the above described filter C1 in real time based on a sound measurement result of a microphone mounted on the mobile phone.

Figure 7:
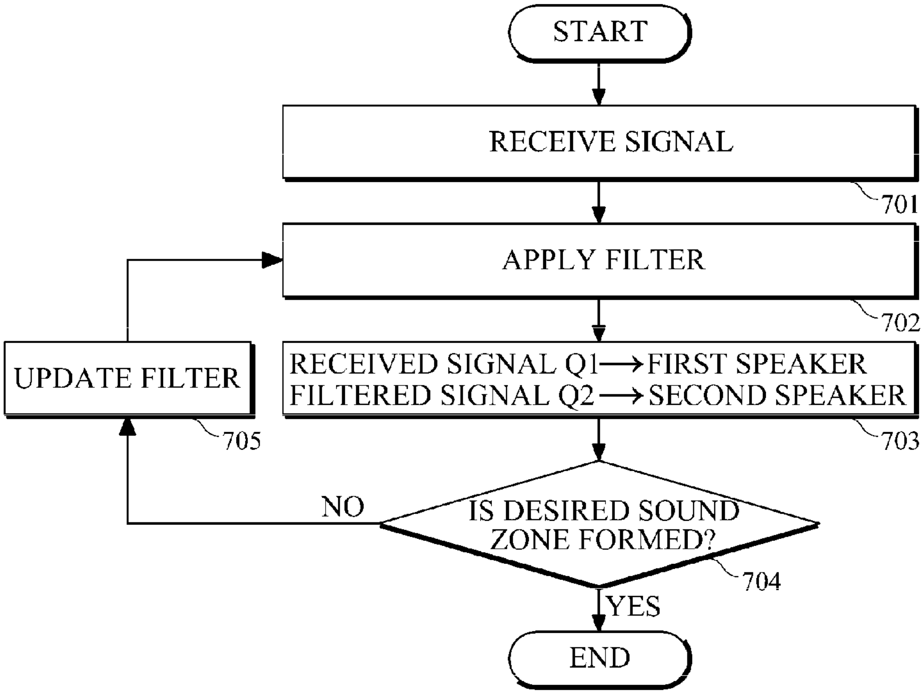
FIG. 7 is a flowchart illustrating an example of a sound focusing method.

FIG. 7 shows a flowchart illustrating an example of a sound focusing method. Referring to FIG. 7, at 701, a signal is received. For example, the signal processing unit 102 (see for example, FIG. 1 or 6) may receive a signal to be transmitted to the speaker unit 101 (see for example, FIG. 1 or 6).

At 702, a predetermined filter is applied to the received signal. The filter may adjust an amplitude and/or a phase of the received signal such that sound field overlap occurs in a first area and sound field cancellation occurs in a second area. For example, the signal processing unit 102 may generate a signal q1 and a signal q2 by use of a filter such as Equation 1, such that the relationship between the signal q1 and the signal q2 can be represented as per Equation 4.

At 703, the received signal and a signal generated by applying the filter to the received signal are, respectively, transmitted to the first speaker 201 and the second speaker 202 (see for example, FIG. 2 or 3), which are placed on the same axis and output sound in opposite directions to each other. For example, the signal processing unit 102 may assign the signal q1, the received signal, to the first speaker 201 and assign the signal q2, the filtered signal, to the second speaker 202.

At 704, it may be determined whether a desired sound zone is formed. In one example, whether the desired sound zone is formed may be determined according to the detection of sound in an area where a sound field is to be cancelled, based on a sound measurement result of the microphone 603 in the update unit 601 (see FIG. 6).

At 705, if the desired sound zone is not formed, the filter may be updated and the above procedures may be repeated. For example, the update unit 601 may adjust the filter in real time.

Figure 8:
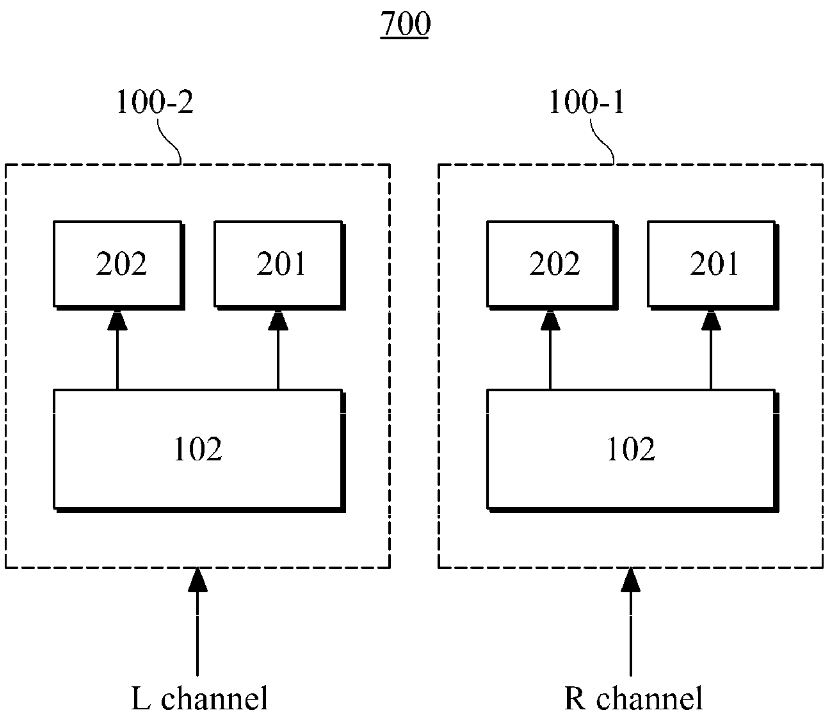
FIG. 8 is a diagram illustrating still another example of a sound focusing apparatus.

FIG. 8 illustrates still another example of a sound focusing apparatus 700. Referring to FIG. 8, the sound focusing apparatus 700 is provided for individual channels. For example, as shown in FIG. 8, the sound focusing apparatus 700 includes a first sound focusing portion 100-1 and a second sound focusing portion 100-2, and the first sound focusing portion 100-1 and the second sound focusing portion 100-2 may provide a stereo sound system by respectively processing an R-channel signal and an L-channel signal.

Figure 9:
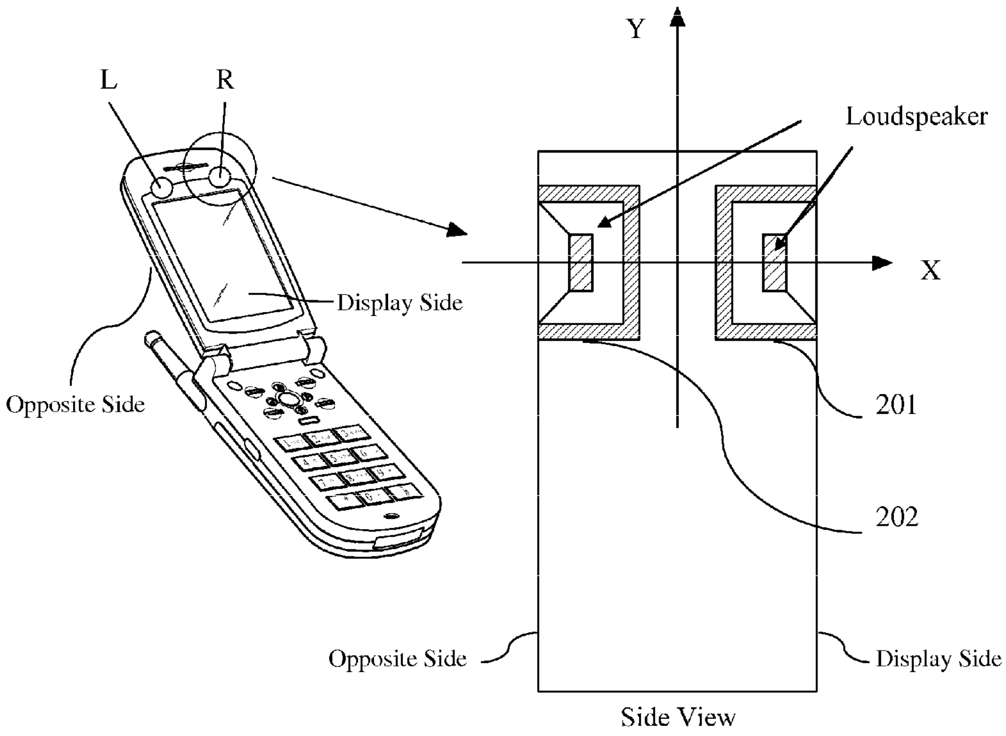
FIG. 9 is a diagram illustrating an example of employing a sound focusing apparatus to a mobile phone.

FIG. 9 illustrates an example of employing a sound focusing apparatus 100 to a mobile phone. Referring to FIG. 9, sound waves emitted from two speakers 201 and 202 overlap in an area where a user is generally located while, for example, listening to a call, and sound waves emitted from the speakers 201 and 202 are cancelled in an opposite area, for example, the side opposite to a side having a display of the mobile phone, away from the area where the user is listening to the call. The overlap and cancellation of the sound waves may be realized by processing a signal to be input to each of the speakers 201 and 202 according to the above-described example methods. A filter for signal processing may be defined based on an acoustic transfer function of each speaker.

In another example, a sound focusing apparatus 700 of FIG. 8 may be provided to the mobile phone of FIG. 9. In this case, a stereo effect may be achieved by way of the left side L of the mobile phone processing an L-channel signal and the right side R of the mobile phone processing an R-channel signal.

The processes, functions, methods and/or software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A sound focusing apparatus comprising:

a speaker unit comprising first and second monopole speakers which are facing opposite directions with respect to a same axis such that the first and second monopole speakers are configured to output sound in opposite directions; and a signal processing unit configured to process a signal to be transmitted to the speaker unit, wherein, in response to the processed signal being input to the first and second monopole speakers facing opposite directions with respect to the same axis, sound fields generated by the speaker unit overlap to strengthen sound in a first area and simultaneously cancel to weaken sound in a second area.

2. The sound focusing apparatus of claim 1, wherein the first area corresponds to a front of the first monopole speaker and the second area corresponds to a front of the second monopole speaker.

3. The sound focusing apparatus of claim 1, wherein the signal processing unit receives the signal, applies a filter to the received signal that adjusts an amplitude and/or a phase of the signal, and assigns the received signal and the filtered signal to the first monopole speaker and the second monopole speaker, respectively.

4. The sound focusing apparatus of claim 3, wherein the filter is defined based on a ratio between an acoustic transfer characteristic of the first monopole speaker and an acoustic transfer characteristic of the second monopole speaker.

5. The sound focusing apparatus of claim 3, further comprising:

an update unit to update the filter using a sound measurement result of the second area.

6. The sound focusing apparatus of claim 5, wherein the update unit comprises a microphone provided to obtain the sound measurement result of the second area.

7. The sound focusing apparatus of claim 1, wherein the speaker unit is configured to overlap the sound fields to strengthen sound in the first area and cancel the sound fields to weaken sound in the second area using only two monopole speakers.

8. The sound focusing apparatus of claim 1, wherein the processed signal input to the first and second monopole speakers causes the first and second monopole speakers to simultaneously generate sound fields such that sound strengthens along a first direction with respect to the same axis and simultaneously weakens along a second direction with respect to the same axis.

9. A sound focusing method of a sound focusing apparatus that has first and second monopole speakers which are facing opposite directions with respect to the same axis such that the first and second speakers are configured to output sound in opposite directions, the method comprising:

receiving a signal and adjusting an amplitude and/or a phase of the received signal by use of a filter; and inputting the received signal and the adjusted signal to the first and second monopole speakers facing opposite directions, wherein, in response to the signal being input to the first and second monopole speakers facing opposite directions with respect to the same axis, sound fields overlap to strengthen sound in a first area and simultaneously cancel to weaken sound in a second area.

10. The sound focusing method of claim 9, wherein the filter is defined based on a ratio between an acoustic transfer characteristic of the first monopole speaker and an acoustic transfer characteristic of the second monopole speaker.

11. The sound focusing method of claim 9, wherein the first area corresponds to the front of the first monopole speaker and the second area corresponds to the front of the second monopole speaker.

12. The sound focusing method of claim 9, further comprising:

updating the filter using a sound measurement result of the second area.

13. A portable sound focusing apparatus comprising:

a speaker unit comprising first and second monopole speakers which are facing opposite directions with respect to the same axis such that the first and second monopole speakers are configured to output sound in opposite directions; and a signal processing unit configured to process a signal to be transmitted to the speaker unit, wherein, in response to the processed signal being input to the first and second monopole speakers facing opposite directions with respect to the same axis, sound fields generated by the speaker unit overlap to reinforce the sound in a first area and simultaneously cancel to weaken or prevent the sound in a second area.

14. The portable sound focusing apparatus of claim 13, wherein a back of the first monopole speaker faces a back of the second monopole speaker.

15. The portable sound focusing apparatus of claim 14, wherein the first and second monopole speakers are placed on the same axis such that a centerline of a loudspeaker of the first monopole speaker passes through a point substantially corresponding to a centerline of a loudspeaker of the second monopole speaker.

16. The portable sound focusing apparatus of claim 15, wherein the first area corresponds to a front of the first monopole speaker and the second area corresponds to a front of the second monopole speaker.

17. The portable sound focusing apparatus of claim 13, wherein the signal processing unit receives the signal, applies a filter to the received signal that adjusts an amplitude and/or a phase of the signal, and assigns the received signal and the filtered signal to the first monopole speaker and the second monopole speaker, respectively, such that the sound fields overlap in the first area and cancel in the second area.

18. The portable sound focusing apparatus of claim 17, wherein the filter is defined based on a ratio between an acoustic transfer characteristic of the first monopole speaker and an acoustic transfer characteristic of the second monopole speaker.

19. The portable sound focusing apparatus of claim 17, further comprising:

an update unit to update the filter using a sound measurement result of the second area.

20. The portable sound focusing apparatus of claim 19, wherein the update unit comprises a microphone provided to obtain the sound measurement result of the second area, and the update unit updates the filter to adaptively control a signal to be assigned to the second speaker.

21. The portable sound focusing apparatus of claim 19, wherein the update unit updates the filter substantially in real time using the sound measurement result of the second area.

22. The portable sound focusing apparatus of claim 17, wherein the portable sound focusing apparatus is a mobile phone.

23. The portable sound focusing apparatus of claim 13, further comprising:

another speaker unit comprising first and second speakers to output sound, wherein the speaker unit and the other speaker unit process an R-channel signal and an L-channel signal, respectively, to provide a stereo sound.

24. The portable sound focusing apparatus of claim 13, wherein the signal processing unit generates a signal q1 and a signal q2 by use of a filter corresponding to an equation, $$C_1 = \mu\frac{H_2(j\omega)}{H_1(j\omega)},$$

where $C_1$ represents the filter, μ represents a pattern control parameter which allows a shape of a sound zone to be changed, $H_1(j\omega)$ represents an acoustic transfer characteristic of the first monopole speaker, and $H_2(j\omega)$ represents an acoustic transfer characteristic of the second monopole speaker, such that the relationship between the signal q1 and the signal q2 is represented as, q2$=-q_1e^{-jkd}$ or $\mu=-e^{-jkd}$, where $e^{-jkd}$ represents a complex number.

25. An electrical device comprising:

a body comprising a first side and a second side opposite the first side;

a first monopole speaker comprising front and back portions and which is mounted to the first side of the body;

a second monopole speaker comprising front and back portions and which is mounted to the second side of the body such that the back portion of the second monopole speaker faces the back portion of the first monopole speaker and the front portions of the first and second monopole speakers face opposite directions with respect to the same axis such that the first and second monopole speakers are configured to output sound in opposite directions; and a signal processing unit configured to process a signal to be transmitted to the first and second monopole speakers, wherein, in response to the processed signal being input to the first and second monopole speakers facing opposite directions with respect to the same axis, sound fields generated by the first and second monopole speakers overlap to strengthen sound in a first area and simultaneously cancel to weaken sound in a second area.

26. The electrical device of claim 25, wherein the first and second monopole speakers are mounted on an axis traversing the first and second sides of the body.

27. The electrical device of claim 25, further comprising a display mounted to the first side of the body.

28. The electrical device of claim 25, wherein the electrical device is a mobile phone.

29. The electrical device of claim 25, wherein an imaginary line traversing the first and second sides of the body passes through centers of the first and second monopole speakers.

30. The electrical device of claim 25, wherein the first and second monopole speakers have a substantially identical frequency response.

31. The electrical device of claim 25, wherein the first and second monopole speaker are substantially identical.

32. The electrical device of claim 25, wherein the back portion of the first monopole speaker and the back portion of the second monopole speaker are separated by about 0.1 cm to 7.0 cm.

33. The electrical device of claim 25, wherein the back portion of the first monopole speaker and the back portion of the second monopole speaker are in contact with each other.

* * * * *